United States Patent
Edwards

(10) Patent No.: US 8,271,915 B1
(45) Date of Patent: Sep. 18, 2012

(54) ONE-PASS METHOD FOR IMPLEMENTING A FLEXIBLE TESTBENCH

(75) Inventor: Gareth D. Edwards, Edinburgh (GB)

(73) Assignee: Xilinx, Inc., San Jose, CA (US)

(*) Notice: Subject to any disclaimer, the term of this patent is extended or adjusted under 35 U.S.C. 154(b) by 715 days.

(21) Appl. No.: 12/416,330

(22) Filed: Apr. 1, 2009

Related U.S. Application Data

(62) Division of application No. 11/344,477, filed on Jan. 31, 2006, now Pat. No. 7,526,742.

(51) Int. Cl.
*G06F 17/50* (2006.01)

(52) U.S. Cl. .......... 716/104; 716/106

(58) Field of Classification Search .......... 716/106–108, 716/111–113
See application file for complete search history.

(56) References Cited

U.S. PATENT DOCUMENTS

| | | | |
|---|---|---|---|
| 6,477,683 B1 | 11/2002 | Killian et al. | |
| 6,493,852 B1 | 12/2002 | Narain et al. | |
| 6,618,839 B1 | 9/2003 | Beardslee et al. | |
| 6,701,501 B2 | 3/2004 | Waters et al. | |
| 6,721,922 B1 | 4/2004 | Walters et al. | |
| 6,725,432 B2 | 4/2004 | Chang et al. | |
| 6,876,941 B2 | 4/2005 | Nightingale | |
| 7,024,345 B1 | 4/2006 | Stamm et al. | |
| 7,069,526 B2 | 6/2006 | Schubert et al. | |
| 7,219,315 B1 | 5/2007 | Stoye et al. | |
| 7,225,416 B1 | 5/2007 | Pritchard et al. | |
| 7,246,332 B2 * | 7/2007 | Likovich et al. | 716/113 |
| 7,246,333 B2 * | 7/2007 | Bingham | 716/106 |
| 7,373,619 B2 | 5/2008 | Johnson | |
| 2003/0217341 A1 | 11/2003 | Rajsuman et al. | |
| 2005/0004777 A1 | 1/2005 | Houlihane | |
| 2006/0107141 A1 | 5/2006 | Hekmatpour | |

OTHER PUBLICATIONS

U.S. Appl. No. 11/131,750, filed May 18, 2005, Secatch.
U.S. Appl. No. 11/344,477, filed Jan. 31, 2006, Edwards.
GDA Technologies, Inc., "Configurable UART," Product Brief, Version 1.0, Aug. 2003, available from GDA Technologies, Inc., 1010 Rincon Circle, San Jose, California 95131, USA.

* cited by examiner

*Primary Examiner* — Jack Chiang
*Assistant Examiner* — Binh Tat
(74) *Attorney, Agent, or Firm* — Kevin T. Cuenot

(57) ABSTRACT

A test environment for performing verification on a parameterizable circuit design can include a test harness specifying a first instance of a device under test characterized by a first parameterization and at least a second instance of the device under test characterized by at least a second parameterization. The test environment further can include a hardware verification language shell configured to randomly generate signals which indicate one of the instances and provide the signals to the test harness. The test harness selects one of the instances according to the signals.

10 Claims, 3 Drawing Sheets

ONE-PASS METHOD FOR IMPLEMENTING A FLEXIBLE TESTBENCH

FIELD OF THE INVENTION

This invention relates to the field of integrated circuits and, more particularly, to testing and verification of integrated circuit designs.

BACKGROUND OF THE INVENTION

Modern integrated circuits (ICs) are developed through the use of hardware description languages (HDLs). HDLs such as VERILOG, VHDL, and the like allow developers to create software-based representations of circuit designs. One advantage of using an HDL is the potential for code reuse from one design to another. This concept has been realized with the commercial availability of intellectual property (IP) cores. In general, an IP core refers to a software representation of a semiconductor, or a portion of a semiconductor, that provides a processing function.

Before HDL logic is made available for commercial use, it must be thoroughly tested and verified. The HDL logic must be tested to ensure that it functions properly and as expected, particularly as defined in the design specification. Typically, this testing is performed using a simulation environment which includes a test harness comprised of HDL descriptions that specify the behavior of a device under test (DUT), in this the case HDL logic such as one or more IP cores. Generating a test harness involves describing the connections, events, and test vectors for different combinations of transactions involving the DUT. In general, the simulation environment provides a deterministic input sequence to the DUT and observes the response, or output, from the DUT.

FIG. 1 is a schematic diagram illustrating an exemplary simulation environment 100. Simulation environment 100 can include a generator 105, a transactor 110, a monitor 115, and a scoreboard 120, each being implemented as a software module or component. Typically, simulation environment 100 is multithreaded in nature, with each of the aforementioned software components operating in a different thread of execution. These components interact with a DUT 125 to perform testing and/or verification. In terms of functionality, the generator 105 can randomly construct data units to be provided to the DUT 125. The transactor 110 can transmit the constructed data units to the DUT 125. The monitor 115 receives processed data units as output from the DUT 125, while the scoreboard 120 compares the input and output units to determine whether the DUT 125 behaved correctly.

In order to adequately test the DUT 125, a series of different test cases, referred to as a test or verification suite, is needed. Each test case can be directed to testing a particular functionality of the DUT 125 and, as such, can include a sequence of user-specified commands. The simulation environment 100 executes these commands, thereby causing particular inputs to be provided to the DUT 125.

Many modern circuit designs are highly parameterizable. That is, the circuit designs can be configured in a variety of different ways depending upon the values assigned to generics and/or parameters of the design. Ideally, to adequately test the circuit design, these generics and parameters should be varied across all tests of the verification suite. Hardware verification languages having randomization engines allow various aspects of a test, such as the inputs to be provided to the DUT 125, to be randomly selected.

Randomization, however, is not available for selecting other parameters of the test case such as the particular DUT configuration to be used. Such is the case because all generics and parameters of the DUT must be specified when the simulation environment is compiled. Accordingly, test personnel must manually specify the DUT configuration, or parameterization, to be implemented prior to running one or more tests of the verification suite. If a different configuration is to be tested, the test personnel manually change the generics and/or parameters of the DUT, re-compile the simulation environment, and restart the testing.

It would be beneficial to provide a technique for testing various configurations and/or parameterizations of a circuit design across multiple tests of a verification suite in a manner that overcomes the limitations described above.

SUMMARY OF THE INVENTION

The present invention provides methods and articles of manufacture relating to testing and/or verification of a parameterizable circuit design. One embodiment of the present invention can include a test environment for performing verification on a parameterizable circuit design. The test environment can include a test harness specifying a first instance of a device under test characterized by a first parameterization and at least a second instance of the device under test characterized by at least a second parameterization. The test environment also can include a hardware verification language shell configured to randomly generate signals which indicate one of the instances and provide the signals to the test harness. The test harness can select one of the instances according to the signals.

The test environment can include software construct communicatively linked with the first and second instances. The software construct can selectively pass output from one of the first or second instances to the hardware verification language shell according to a signal received by the software construct from the hardware verification language shell. In one embodiment, the software construct can specify a multiplexer. In another embodiment, the software construct can include a plurality of conditional hardware description language statements.

In one embodiment, the hardware verification language shell can include a plurality of transactors. Each instance can be associated with one of the plurality of transactors. The plurality of transactors can convey signals from the hardware verification language shell to the first and second instances. In another embodiment, the hardware verification language shell can include a single transactor configured to convey signals from the hardware verification language shell to the first and second instances.

The hardware verification language shell can include a generator configured to generate signals to be provided to the first and second instances. The hardware verification language shell further can include a plurality of monitors. Each instance can be associated with at least one of the plurality of monitors and at least one of the plurality of monitors can be chosen according to the selected instance.

Another embodiment of the present invention can include a method of testing a parameterizable circuit design. The method can include randomly selecting one of a plurality of instances of a device under test specified by a test harness. Each instance can be characterized by a particular parameterization. Signals indicating the selected instance can be provided to the test harness. Data provided as output from the selected instance can be compared to expected output to verify at least one function of the selected instance.

The method can include creating signals to be provided to each of the plurality of instances. The providing step can include sending signals to each of the plurality of instances through at least one transactor. Output data from the selected instance can be routed to a monitor of the hardware verification language shell associated with the selected instance. The method also can include switching between instances in the test harness responsive to different signals applied to the test harness, for instance, by applying different signals to a switch construct within the test harness.

Yet another embodiment of the present invention can include a machine readable storage, having stored thereon, a computer program having a plurality of code sections for implementing the various steps and functions disclosed herein.

BRIEF DESCRIPTION OF THE DRAWINGS

There are shown in the drawings, embodiments which are presently preferred; it being understood, however, that the invention is not limited to the precise arrangements and instrumentalities shown.

DETAILED DESCRIPTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The embodiments disclosed herein relate to testing and verification of integrated circuit designs. In accordance with the embodiments disclosed herein, a test harness can be created which includes multiple instances of a circuit design to be tested, also referred to as the device under test (DUT). The circuit design is parameterizable in that various parameters and/or generics for the circuit design can be set or assigned to effectively change the functionality of the circuit design and/or a physical aspect of the circuit design such as the input port configuration. Each instance of the circuit design will have a particular, predetermined parameterization, which differs from the others.

The embodiments described herein utilize signals to select a parameterization of the DUT. Signals can vary across component boundaries at runtime in a simulation environment. Accordingly, the signals generated during a simulation can be used to select among the various instances of the DUT in the test harness. Since each DUT instance has a potentially different parameterization, different parameterizations of the DUT can be tested during a single simulation session. Moreover, the test environment can be generated through a single processing pass as will be described in greater detail herein.

Figure 1:
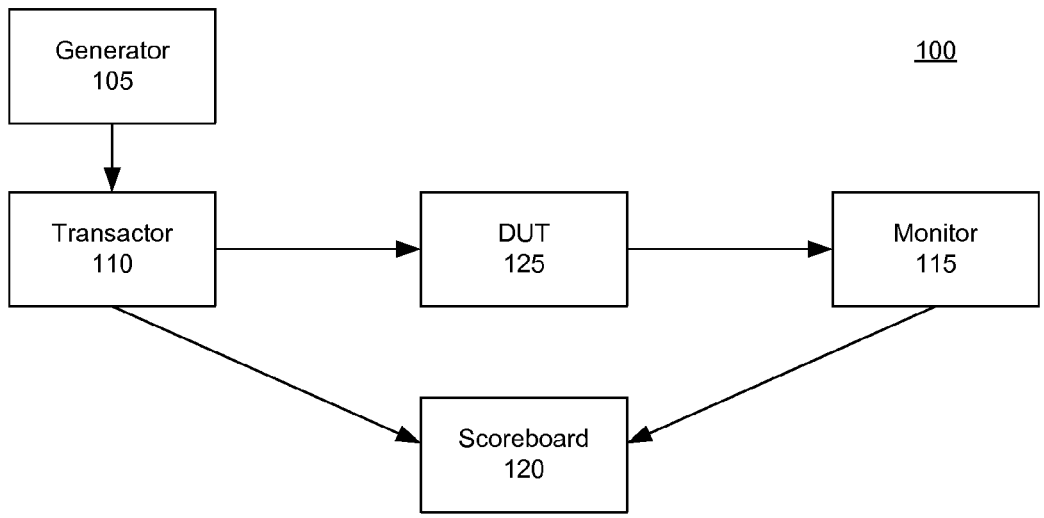
FIG. 1 is a block diagram illustrating a conventional simulation environment.
Figure 2:
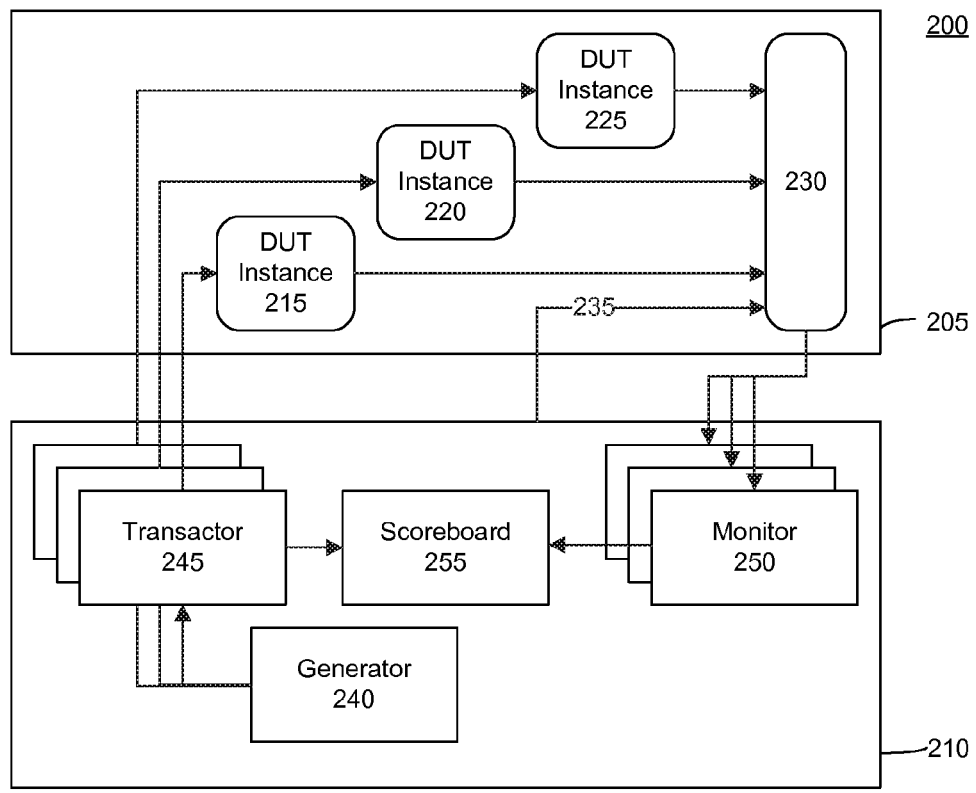
FIG. 2 is a block diagram illustrating a simulation environment in accordance with one embodiment of the present invention.

FIG. 2 is a block diagram illustrating a simulation environment 200 in accordance with one embodiment of the present invention. The simulation environment 200 can include a hardware description language (HDL) test harness 205 (hereafter "test harness") as well as a hardware verification language (HVL) shell 210. The elements of the simulation environment 200 discussed herein can be implemented as software modules executing in concert with, or by, an HDL simulator (not shown) within one or more suitable information processing systems.

The test harness 205 is comprised of HDL descriptions that specify the behavior of an electrical circuit referred to as the DUT. In accordance with the embodiments disclosed herein, the DUT being tested, for example an IP core, can be parameterizable in that the DUT can be configured differently with respect to inputs, outputs, and/or functionality, by selecting values for different parameters of the DUT. The test harness 205 specifies several instances of the DUT which are denoted as DUT instances 215, 220, and 225. Each of the DUT instances 215-225 can be configured with a different parameterization, thereby ascribing a different functionality or physical configuration to each. This allows each DUT instance 215-225 to be configured or suited for testing a particular aspect or function of the DUT.

The test harness 205 further includes a switching object, or construct, 230 which receives output signals from each of the DUT instances 215-225 and selectively passes output from one of the instances back to the HVL shell 210. In one embodiment, the switch construct 230 can specify as a multiplexer. In another embodiment, the switch 230 can be implemented using a series of conditional HDL statements such as if-generate statements. The particular DUT instance from which output signals are allowed to pass is selected via a control signal 235 that is provided by the HVL shell 210. HVL shell 210, for instance, can include an object referred to as a test configuration descriptor (not shown) that drives control signal 235 or instructs another component to provide or send such a signal.

The HVL shell 210 can include a generator 240, one or more transactors 245, a monitor 250, and a scoreboard 255. The generator 105 randomly constructs data units to be provided to the DUT 125. The transactors 245 establish connections to the various input ports of the DUT instances 215-225 and provide input signals thereto. In one embodiment, as shown, each DUT instance 215-225 can be associated with its own transactor 245. In another embodiment, however, a single transactor can be used to drive each DUT instance 215-225. Similarly, each DUT instance 215-225 can be associated with its own monitor 250. Each monitor 250 is configured to receive output from its corresponding DUT instance via switch 230. The scoreboard 255 examines the output units to determine whether the DUT instances 215-225 behaved correctly.

In one embodiment the HVL shell 210 can be coded in an HVL such as OpenVera™, SystemVerilog, SpecMan-e, or another HVL having a randomization engine. OpenVera is a concurrent, imperative language designed for writing testbenches. It executes in concert with an HDL simulator and can both provide stimulus to the simulator and observe the results. In addition to the conventional high-level imperative language constructs, such as conditionals, loops, functions, strings, and associative arrays, OpenVera provides extensive facilities for generating biased random patterns and monitoring what values particular variables take on during the simulation.

OpenVera provides a broad range of constructs which enable constraint-driven, random test stimulus generation, real time self-checking, functional coverage, and temporal assertions. OpenVera further provides a robust randomization engine which supports randomization of the simulation environment with respect to module selection and module configuration. The randomization functions of an HVL, such as OpenVera, can be used to randomize one or more aspects of the DUT. It should be appreciated, however, that the present invention is not limited by the particular HVL used, so long as the selected HVL provides randomization functions substantially as described herein.

Conventional HDLs do not allow generics to be changed at run time. Instead, these values must be fixed at compile time. To adequately test a given DUT, however, the generics which configure the DUT must be set to all of the valid values at some point during the testing process. This ensures that all, or most, configurations of the core are subjected to testing. In accordance with the inventive arrangements disclosed herein, a single pass methodology can be implemented which utilizes the randomization engine of the HVL to select particular DUT instances 215-225 to be tested through the generation of signals that will be provided to the test harness 205. Thus, the simulation environment 200 can be used to test a plurality of different parameterizations for a single DUT.

Figure 3:
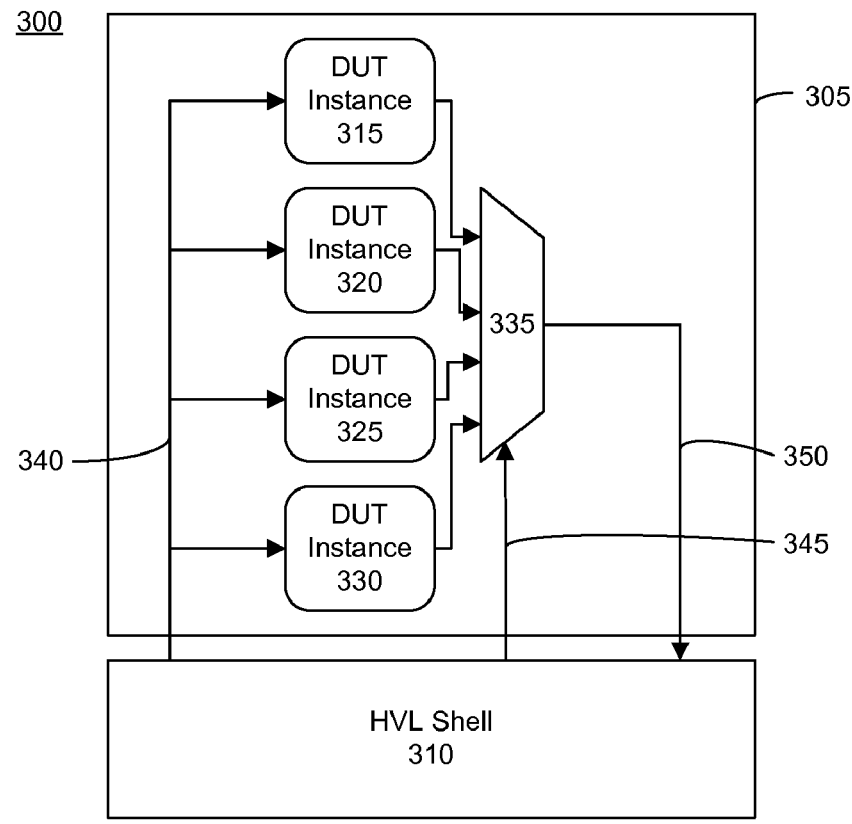
FIG. 3 is a block diagram illustrating a simulation environment in accordance with another embodiment of the present invention.

FIG. 3 is a block diagram illustrating a simulation environment 300 in accordance with another embodiment of the present invention. As shown, the simulation environment 300 includes a test harness 305 and an HVL shell 310. The test harness 305 specifies four DUT instances 315, 320, 325, and 330. Each of the DUT instances can be characterized by a different parameterization. For purposes of illustration, DUT instances 315-330 can be characterized by two Boolean generics or parameters, denoted as C_Does_X and C_Solves_Y, that alter the behavior of the DUT instances 315-330, but do not alter the port map.

Accordingly, DUT instance 315 can be parameterized as C_Does_X=False and C_Solves_Y=False. DUT instance 320 can be parameterized as C_Does_X=False and C_Solves_Y=True. DUT instance 325 can be parameterized as C_Does_X=True and C_Solves_Y=False. Finally, DUT instance 330 can be parameterized as C_Does_X=True and C_Solves_Y=True.

Stimulus signals 340 are provided to the DUT instances 315-330 from the HVL shell 310. The DUT instances 315-330 can be fed signals via one or more transactors (not shown), as the case may be. The HVL shell 310 further provides a control signal 345 to switch 335 to select the particular DUT instance from which output will be provided back to the HVL shell 310 via switch output 350.

Figure 4:
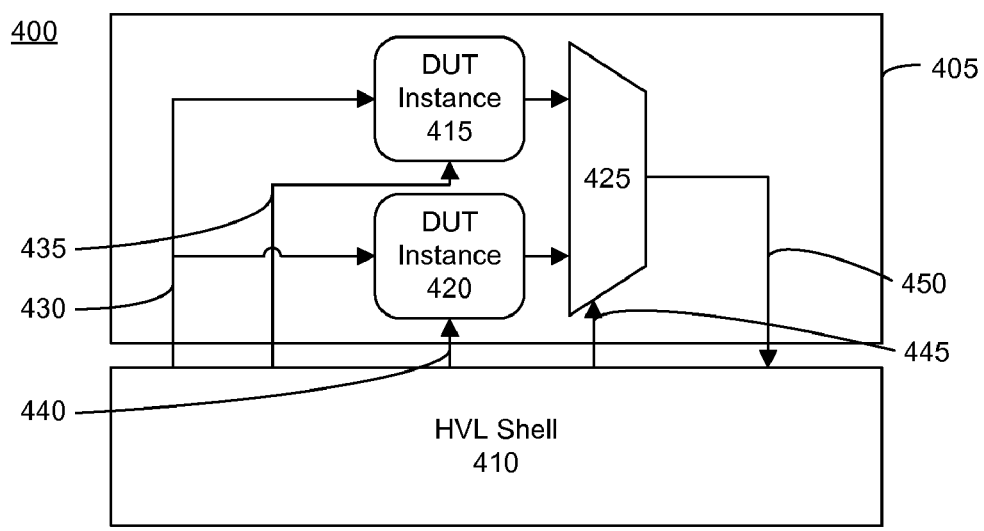
FIG. 4 is a block diagram illustrating a simulation environment in accordance with yet another embodiment of the present invention.

FIG. 4 is a block diagram illustrating a simulation environment 400 in accordance with yet another embodiment of the present invention. Simulation environment 400 illustrates an embodiment in which the DUT is characterized by parameterizations which alter the interface to the DUT. For example, the DUT can be configured using generics and/or parameters which control the presence or absence of a particular interface, group of ports, and/or a single port.

Accordingly, simulation environment 400 includes a test harness 405 and an HVL shell 410. The test harness 405 can specify two DUT instances 415 and 420. The DUT instances 415 and 420 each can include a parameter which dictates whether the DUT will have a Management Data Input/Output (MDIO) interface or whether the DUT instance will utilize a status vector as input. Accordingly, the test harness can be written such that DUT instance 415 is parameterized with an MDIO interface and DUT instance 420 is parameterized with a status vector input.

The HVL shell 405 provides stimulus signals 430 to each DUT instance. The HVL shell 405 further includes an MDIO transactor (not shown) for supplying input to DUT instance 415 via signals 435 and a status vector transactor (not shown) for supplying input to DUT instance 420 via signals 440. The HVL shell 405 provides a control signal 445 to switch 425 for selecting the particular DUT instance from which output will be passed back to the HVL shell 405 via signals 450.

Figure 5:
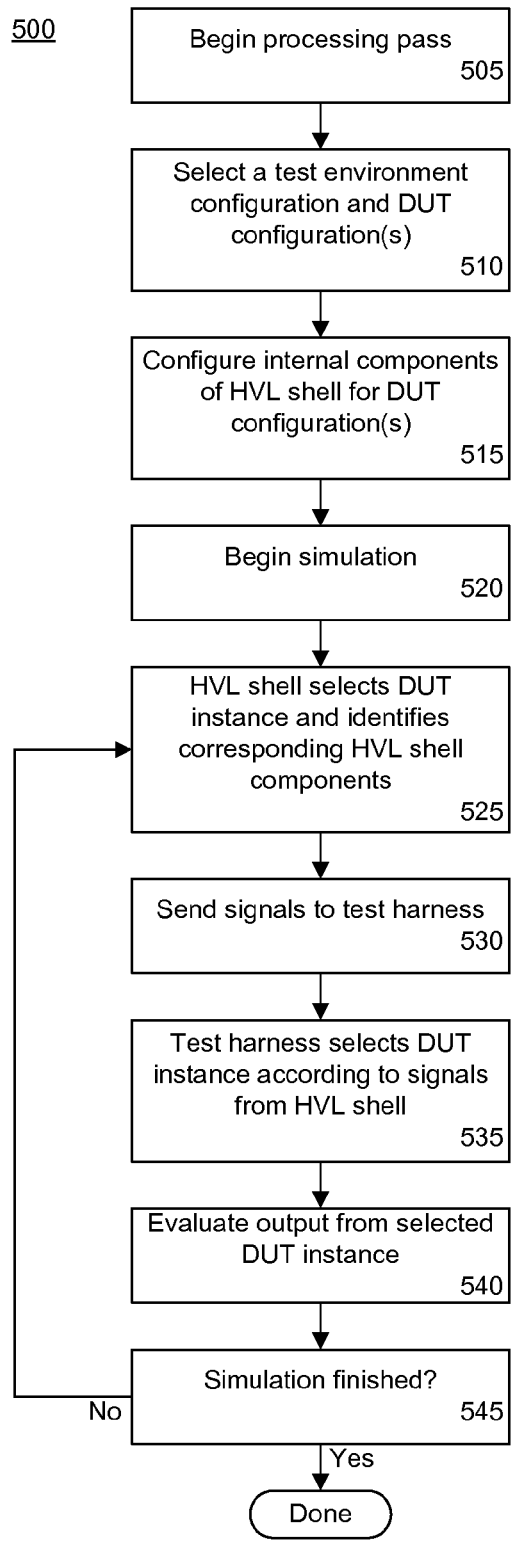
FIG. 5 is a flow chart illustrating a method of testing a circuit design in accordance with another embodiment of the present invention.

FIG. 5 is a flow chart illustrating a method 500 of testing a circuit design in accordance with another embodiment of the present invention. Accordingly, in step 505, a single processing pass can begin. The processing pass refers to a preprocessing pass that is performed prior to execution of the simulation environment. In step 510, an HVL randomization engine selects a particular test harness to be used for simulation purposes as well as a corresponding HVL shell configuration.

Within established limits set by test personnel, the HVL randomization engine selects a particular test harness which specifies a collection of DUT instances to be used. As noted, each of the DUT instances can correspond to a different, or particular, parameterization of the DUT. The HVL randomization engine further selects a configuration for the HVL shell which corresponds to the selected test harness configuration. For example, the HVL shell can be configured with the number of transactors and monitors needed to properly interact with the DUT instances of the test harness.

In step 515, the different components of the HVL shell can be configured to interact with the DUT instances of the test harness. Particular transactors, generators, and monitors can be created according to the test harness configuration. For example, a status vector transactor may be needed for one DUT instance while a MDIO transactor is required for another. Each transactor of the HVL shell can be configured to interact with the DUT instance to which that transactor is to provide signals. Each monitor can be configured to interact with the particular DUT instance from which that monitor is to receive signals.

In step 520, the simulation can be started. Accordingly, in step 525, the HVL shell can select the particular DUT instance to be tested along with the corresponding HVL shell components. In step 530, the HVL shell generates and sends signals to DUT instances via the appropriate components, i.e. transactor or transactors depending upon the configuration used. In step 535, the test harness selects the appropriate DUT instance according to the received signals. For example, the switching logic can selectively pass output signals from the selected DUT instance back to the HVL shell.

In step 540, the output from the selected DUT instance can be evaluated against expected output. In step 545, a determination can be made as to whether the simulation has finished. If so, the method can end. If not, the method can loop back to step 525 to select another DUT instance and continue processing as may be required. The outputs from various instances of the DUT can be compared with expected outputs corresponding to each respective DUT parameterization. By selecting which DUT parameterization provides output at any given time, multiple parameterizations of the DUT to be tested in a single test session.

The present invention can be realized in hardware, software, or a combination of hardware and software. The present invention can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein. The present invention also can be embedded in a computer program product, which comprises all the features enabling the implementation of the methods described herein, and which when loaded in a computer system is able to carry out these methods.

The terms "computer program", "software", "application", variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an", as used herein, are defined as one or more than one. The term "plurality", as used herein, is defined as two or more than two. The term "another", as used herein, is defined as at least a second or more. The terms "including" and/or "having", as used herein, are defined as comprising (i.e., open language). The term "coupled", as used herein, is defined as connected, although not necessarily directly, and not necessarily mechanically, i.e. communicatively linked through a communication channel or pathway or another component or system.

This invention can be embodied in other forms without departing from the spirit or essential attributes thereof. Accordingly, reference should be made to the following claims, rather than to the foregoing specification, as indicating the scope of the invention.

What is claimed is:

1. A method of testing a parameterizable circuit design comprising:
    randomly selecting one of a plurality of instances of a device under test specified by a test harness using a computer, wherein each instance of the plurality of instances of the device under test has a different parameterization;
    providing signals to the test harness, wherein the signals indicate the selected instance;
    comparing data provided as output from the selected instance to expected output to verify at least one function of the selected instance; and
    switching between the plurality of instances of the device under test in the test harness responsive to applying different signals to a switching construct within the test harness.

2. The method of claim 1, further comprising creating signals to be provided to each of the plurality of instances.

3. The method of claim 2, said providing further comprising sending signals to each of the plurality of instances through at least one transactor.

4. The method of claim 1, further comprising routing output data from the selected instance to a monitor of the hardware verification language shell associated with the selected instance.

5. A non-transitory machine readable medium having a plurality of code sections comprising:
    code for randomly selecting one of a plurality of parameterizable instances of a device under test specified by a test harness, wherein each instance of the plurality of instances of the device under test has a different parameterization;
    code for providing signals to the test harness, wherein the signals indicate the selected instance;
    code for comparing data provided as output from the selected instance to expected output to verify at least one function of the selected instance; and
    code for switching between the plurality of instances of the device under test in the test harness responsive to applying different signals to a switching construct within the test harness.

6. The machine readable storage medium of claim 5, further comprising code for creating signals to be provided to each of the plurality of instances.

7. The machine readable storage medium of claim 6, said code for providing further comprising code for sending signals to each of the plurality of instances.

8. The machine readable storage medium of claim 5, further comprising code for routing output data from the selected instance to a monitor of the hardware verification language shell associated with the selected instance.

9. The method of claim 1, wherein the test harness is a single test harness.

10. The machine readable storage medium of claim 5, wherein the test harness is a single test harness.

* * * * *